(12) United States Patent
Call et al.

(10) Patent No.: US 10,276,534 B2
(45) Date of Patent: Apr. 30, 2019

(54) REDUCTION OF SOLDER INTERCONNECT STRESS

(71) Applicant: International Business Machines Corporation, Armonk, NY (US)

(72) Inventors: Anson J. Call, Poughkeepsie, NY (US); Vijayeshwar D. Khanna, Millwood, NY (US); David J. Russell, Owego, NY (US); Krishna R. Tunga, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/671,955

(22) Filed: Aug. 8, 2017

(65) Prior Publication Data
US 2018/0061799 A1 Mar. 1, 2018

Related U.S. Application Data

(62) Division of application No. 15/251,325, filed on Aug. 30, 2016, now Pat. No. 9,865,557.

(51) Int. Cl.
*H01L 23/48* (2006.01)
*H01L 23/00* (2006.01)
(Continued)

(52) U.S. Cl.
CPC .......... *H01L 24/17* (2013.01); *H01L 21/4853* (2013.01); *H01L 23/49838* (2013.01); *H01L 24/16* (2013.01); *H01L 2224/16227* (2013.01); *H01L 2224/17133* (2013.01); *H01L 2924/3512* (2013.01)

(58) Field of Classification Search
None
See application file for complete search history.

(56) References Cited

U.S. PATENT DOCUMENTS 3,871,015 A 3/1975 Lin et al.
5,315,485 A 5/1994 Magill et al.
(Continued)

OTHER PUBLICATIONS

List of IBM Patents or Patent Applications Treated as Related, dated herewith.

*Primary Examiner* — Hung Vu
(74) *Attorney, Agent, or Firm* — ZIP Group PLLC

(57) ABSTRACT

A first electrical contact and second contact is upon an interposer and/or upon a processing device. The first contact includes a minor axis and a major axis. The second contact includes diameter axes. The first contact is positioned such that the major axis is generally aligned with the direction of expansion of the interposer and/or the processing device. The first electrical contact may further be positioned within a power/ground or input/output (I/O) region of the interposer and/or processing device. The first electrical contact may further be positioned within a center region that is surrounded by a perimeter region of the interposer and/or the processing device. The dimensions or aspect ratios of major and minor axes of neighboring first electrical contacts within an electrical contact grid may differ relative thereto. Further, the angle of respective major and minor axes of neighboring first electrical contacts within the electrical contact grid may differ relative thereto.

14 Claims, 10 Drawing Sheets

(51) Int. Cl.
*H01L 23/498* (2006.01)
*H01L 21/48* (2006.01)

(56) References Cited

U.S. PATENT DOCUMENTS

| | | |
|---|---|---|
| 5,471,090 A | 11/1995 | Deutsch et al. |
| 5,484,963 A | 1/1996 | Washino |
| 5,859,474 A | 1/1999 | Dordi |
| 6,268,568 B1 | 7/2001 | Kim |
| 6,774,474 B1 | 8/2004 | Caletka et al. |
| 7,312,529 B2 | 12/2007 | Clevenger et al. |
| 7,772,104 B2 | 8/2010 | Pham et al. |
| 8,047,421 B2 | 11/2011 | Sri-Jayantha et al. |
| 8,847,391 B2 | 9/2014 | Bao et al. |
| 9,233,835 B2 | 1/2016 | Aleksov et al. |
| 2008/0185735 A1 | 8/2008 | Pham et al. |
| 2013/0335939 A1* | 12/2013 | Aleksov ............ H01L 23/49816 361/773 |
| 2015/0364404 A1* | 12/2015 | Chen .................... H01L 23/544 257/759 |

\* cited by examiner

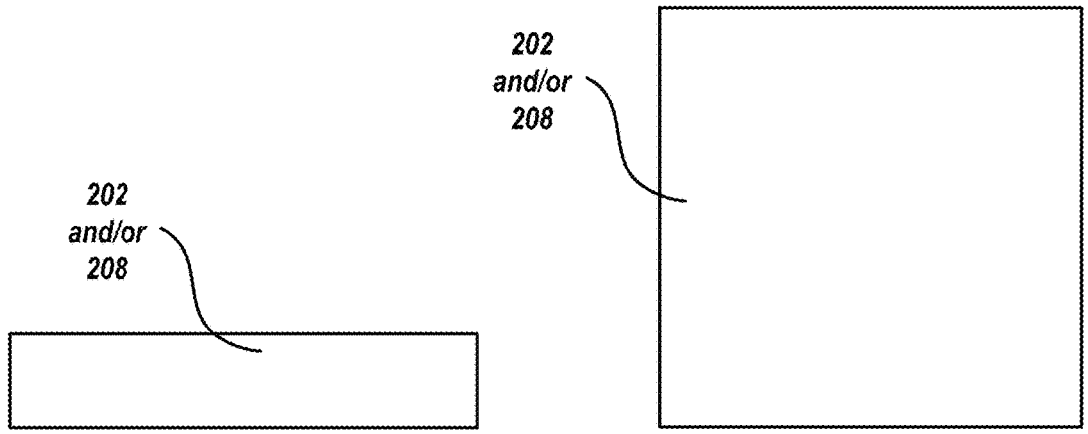
FIG. 12A                    FIG. 12B
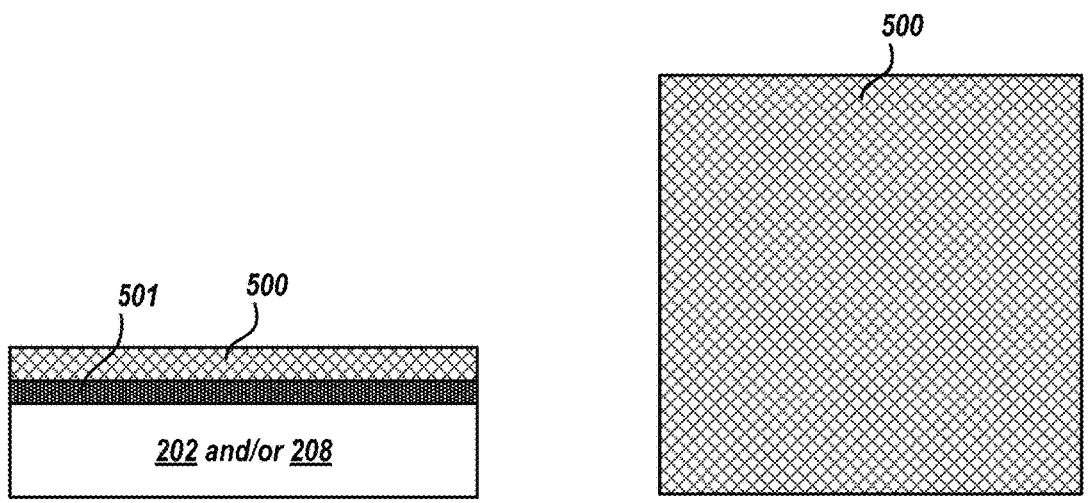
FIG. 13A                    FIG. 13B

REDUCTION OF SOLDER INTERCONNECT STRESS

FIELD OF THE EMBODIMENTS

Embodiments of the present invention generally relate to electronic devices or electronic packages and more specifically to the reduction of solder interconnect stress.

DESCRIPTION OF THE RELATED ART

An electronic package may include an integrated circuit (IC) chip, semiconductor die, processor, and the like, herein referred to as a processing device, packaged onto a carrier or substrate, herein referred to an interposer. The processing device may be encapsulated by a cover having high thermal conductivity. A heat sink may be thermally connected to the cover to cool the processing device during operation of the electronic device where electrical energy is used by the processing device which results in the heating of the processing device. In some instances, there is no cover and the heat sink is attached directly to the processing device. The heat sink generally removes heat from the processing device causing the processing device to operate at a lower temperature. The electronic package may be within and utilized by a larger electronic system such as a computer, server, cash machine, kiosk, infotainment system, or the like.

The heating of the electronic package results in the physical or dimensional expansion of the processing device and the interposer. Typically, the processing device and the interposer do not expand uniformly. The expansion differences are generally due to the interposer having a larger coefficient of thermal expansion (CTE) relative to the processing device and result in stresses within one or more of the electrical solder interconnects that connect the processing device with the interposer. For example, shear forces may be exerted upon a solder interconnect by the movement of the interposer relative to the processing device resulting in shear stress/strain within the solder interconnect. Further, particular solder interconnects may be subject to greater strain due to their particular location between the processing device and the interposer. One solution to reduce such stresses has been to fabricate the processing device and the interposer with materials having similar CTEs. However, electrical performance of the electronic package may be reduced with this solution. Further, such a solution may also result in the utilization of ceramic based interposer materials that are prohibitively expensive and could result in stress corrosion cracking within the electronic package.

SUMMARY

In an embodiment of the present invention, an interposer includes a matrix of contacts arranged in rows and columns. The matrix of contacts include a plurality of first contacts each including a major axis and a minor axis and a plurality of second contacts each including diameter axes. The major axis the plurality of first contacts are aligned with a direction of expansion of the interposer.

In another embodiment of the present invention, a processing device includes a matrix of contacts arranged in rows and columns. The matrix of contacts include a plurality of first contacts each including a major axis and a minor axis and a plurality of second contacts each including diameter axes. The major axis the plurality of first contacts are aligned with a direction of expansion of the processing device.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 12A and FIG. 12B depict an electronic package structure at a particular stage of fabrication, according to one or more embodiments of the present invention.

FIG. 13A and FIG. 13B depict an electronic package structure at a subsequent stage of fabrication, according to one or more embodiments of the present invention.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Embodiments of the present invention are related to electrical contacts upon an interposer and/or upon a processing device that include a minor axis and a major axis. The electrical contacts are positioned such that the major axis is generally aligned with the direction of expansion of the interposer and/or the processing device. The electrical contacts may further be positioned within a power and/or ground input/output (I/O) region of the processing device. The electrical contacts may further be positioned within a central region of the processing device that is surrounded by a perimeter signal region of the processing device. The dimensions respective major and minor axes of neighboring electrical contacts within an electrical contact grid may differ relative thereto. Further, the angle of respective major and minor axes of neighboring electrical contacts within an electrical contact grid may differ relative thereto.

Figure 1:
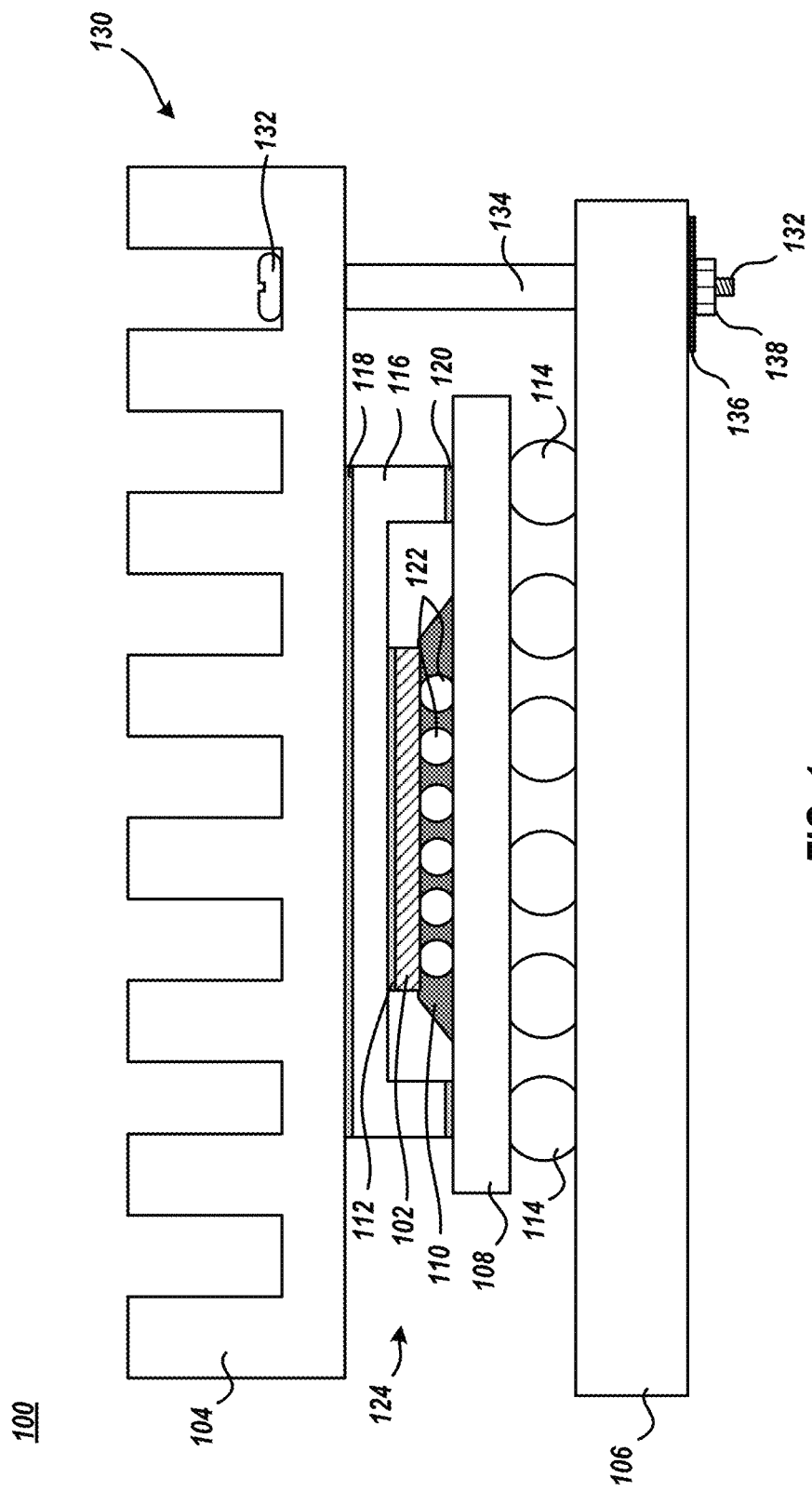
FIG. 1 depicts a prior art system including an electronic package, motherboard, and heat sink.

FIG. 1 depicts a prior art electronic device system 100 that includes electronic package 124 which is cooled by a heat sink 104 and is connected to motherboard 106. Electronic system 100 may be included within a larger electronic data handling system such as, for example, a computer, server, kiosk, and the like. Electronic package 124 includes processing device 102, interposer 108, interconnects 122, thermal interface material 112, lid 116, and adhesive 120. Processing device 102 may be an integrated circuit, semiconductor die, processor, microchip, and the like. Interposer 108 may be a substrate, an organic carrier, a ceramic carrier, or the like, and provides mechanical support for processing device 102 and electrical paths from the upper surface of interposer 108 to the opposing side of interposer 108. Interconnects 122 electrically connect processing device 102 and the upper side of interposer 108 and may be a wire bond, solder bond, stud, conductive ball, conductive button, and the like. Underfill 110 may be included within system 100 and is electrically-insulating, may substantially surround interconnects 122, may electrically isolate individual interconnects 122, and may provide mechanical support between processing device 102 and interposer 108. Underfill 110 may aid to prevent damage to individual interconnects 122 due to thermal expansion mismatches between processing device 102 and interposer 108.

When processing device 102 is aligned against interposer 108, a reflow process may be performed to join interconnects 122 to electrical contacts of both processing device 102 and interposer 108 thereby seating the processing device 102 to interposer 108. After processing device 102 is seated to interposer 108, a lid 116 may be attached to interposer 108 with adhesive 120 to cover processing device 102. Generally, during operation of processing device 102, heat needs to be removed from processing device 102. In this situation, lid 116 is both a cover and a conduit for heat transfer. As such, a thermal interface material 112 may thermally join lid 116 and processing device 102.

Electronic package 124 may be connected to a mother board 106 via interconnects 114. Motherboard 106 may be the main printed circuit board of electronic device 100 and includes electronic components, such as a graphics processing unit, memory, and the like, and provides connectors for other peripherals. Interconnects 114 electrically connect the lower side of interposer 108 to motherboard 106 and may be a wire bond, solder bond, stud, conductive ball, conductive button, and the like. Interconnects 114 may be larger and thus more robust than interconnects 122. When electronic package 124 is aligned upon motherboard 106 a second reflow process may be performed to join interconnects 114 to electrical contacts of both interposer 108 and motherboard 106.

To assist in the removal of heat from processing device 102 a heat sink 104 may be thermally joined to electronic package 124 via thermal interface material 118. Heat sink 104 may be a passive heat exchanger that cools processing device 102 by dissipating heat into the surrounding air. As such, during operation of electronic device 100, a thermal path exists from processing device 102 to heat sink 104 through thermal interface material 112, lid 116, and thermal interface material 118, and the like. Heat sink 104 includes a base and fins. The lower surface of the base may be thermally connected to lid 116 via thermal interface material 118. Fins are connected to the upper side of base and are generally spaced apart so as to allow fluid to exist, or flow, between each fin.

Heat sink 104 may be connected to motherboard 106 via one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon electronic package 124 by heat sink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heat sink 104 upon electronic package 124.

Thermally connected, joined, and the like, shall herein mean that elements which are thermally connected transfer heat there between by at least indirect conduction. Electrically connected, and the like, shall herein mean that current is able to be intentionally passed from one element to another element (e.g., current flows from a conductor in one element to a conductor in the other element).

Figure 2:
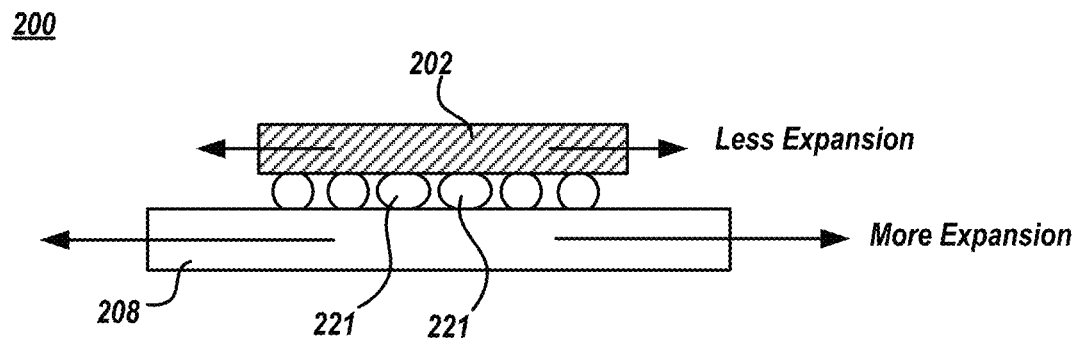
FIG. 2 depicts a side view of an electronic package, according to one or more embodiments of the present invention.

FIG. 2 depicts a side view of an electronic package 200, according to one or more embodiments of the present invention. Electronic package 200 includes processing device 202 and interposer 208 that are connected (e.g., electrically connected, etc.) by numerous solder interconnects 221. Processing device 202 may be the same device as processing device 102 and interposer 208 may be the same device as interposer 108 and may, for example, be utilized in place thereof within system 100 or the like. Similarly, electronic package 200 may be utilized in place of electronic package 124 within system 100. Processing device 202 and/or interposer 208 includes numerous electrically conductive contacts (not shown). A plurality of contacts include a minor axis and a major axis. The term "major axis" is defined herein to be the longer axis of an object, passing through the foci of the object and the term "minor axis" is defined herein to be the shorter axis of the object, passing through the foci of the object. In embodiments, the major axis and minor axis of a particular contact may be orthogonal.

The electrical contacts are positioned upon the processing device 202 and/or the interposer 208 such that the major axis is generally aligned with the direction of expansion of the interposer 208 and/or the processing device 202. The direction of expansion of the processing device and/or the interposer is exemplary depicted in the Figures by arrows. A contact having a major axis and minor axis of the processing device 202 may be aligned with a contact having a major axis and minor axis of the interposer 208. A solder interconnect 221 may electrically connect the respective contacts by, e.g., reflowing the solder interconnect 221. Subsequent to the solder reflow, the solder interconnect 221 takes the shape of the contacts at the contact and solder interconnect 221 interface. After solder reflow, the solder interconnect top surface has a major axis and minor axis and the solder interconnect bottom surface also has a major axis and minor axis. Solder interconnect 221 may be a C4 type solder, solder sphere, micro solder sphere, or the like.

The heating of the electronic package 200 results in the physical or dimensional expansion of the processing device 202 and the interposer 208. Typically, the processing device 202 and the interposer 208 do not expand uniformly. The expansion differences are generally due to the interposer 208 having a larger coefficient of thermal expansion (CTE) relative to the processing device 202 and result in the processing device 202 expanding less relative to the interposer 208. The relative movement between the processing device 202 and interposer 208 results in stresses within the solder interconnects. Therefore, it may be advantageous to reduce the relative movement between the processing device 202 and interposer 208 to reduce the stresses within the solder interconnects. Thus it is an object of one or more embodiments to align a major axis of a contact with the direction of expansion of the interposer 208 and/or the processing device 202 to restrict relative movement therebetween and to reduce the resulting stresses within one or more solder interconnects that connect the processing device 202 with the interposer 208.

The electrical contacts may further be positioned within a power and/or ground input/output (I/O) region of the processing device. The electrical contacts may further be positioned within a central region of the processing device that is surrounded by a perimeter region of the processing device. The dimensions respective major and minor axes of neighboring electrical contacts within an electrical contact grid may differ relative thereto. Further, the angle of respective major and minor axes of neighboring electrical contacts within an electrical contact grid may differ relative thereto.

In embodiments, the processing device 202 and/or interposer 208 may have additional contacts (i.e. one or more contacts in addition to the one or more contacts that each have a major axis and minor axis) that have an infinite number of diameter axes. The term "diameter axes," or the like, means multiple axes of an object that bisect the object and that pass through the foci of the object.

Figure 3:
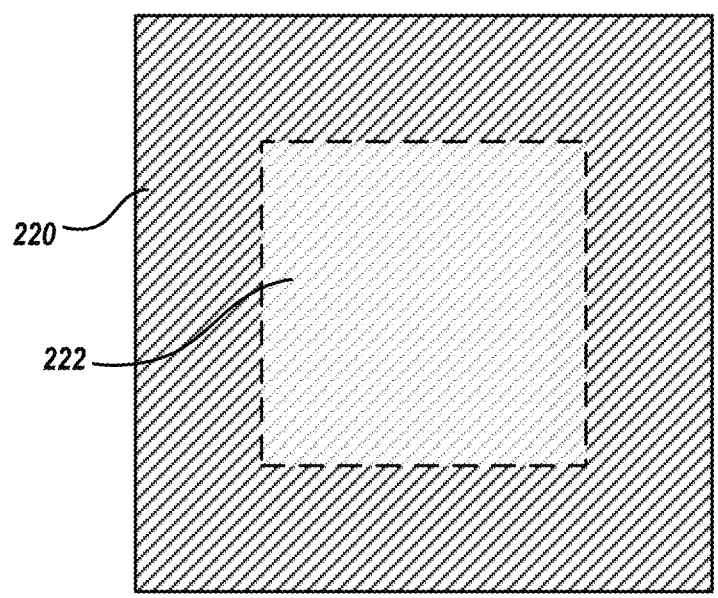
FIG. 3 depicts a normal view of a processing device of an electronic package, according to one or more embodiments of the present invention.

FIG. 3 depicts a normal view of a processing device 202 of an electronic package, according to one or more embodiments of the present invention. For example, FIG. 3 depicts a top side and/or bottom side view of processing device 202. Processing device 202 may comprise a power/ground region 222 and IO region 220. The one or more electrical contacts having a major axis and minor axis may be located within power/ground region 222. The one or more electrical contacts have diameter axes may be located within IO region 220. IO region 220 of processing device 202 is the location(s) of processing device 202 that which an electronic communication signal emanates from or is received by processing device 202. The electronic communication signal is a communication signal associated with the processing device 202 handling functional data so that the larger system that which includes the processing device 202 may produce an operational use. Power/ground region 222 of processing device 202 is the location(s) of processing device 202 that which a reference power signal or reference ground signal are transmitted to or from processing device 202.

The electrical contacts may further be positioned within the quintain of processing device 202. The term quintain means a center region of that is completely surrounded by a perimeter region; the perimeter region includes at least the perimeter of a reference device or structure. The one or more electrical contacts having the major axis and minor axis may be located within the quintain of processing device 202. The one or more electrical contacts that have diameter axes may be located within the perimeter region surrounding the quintain of processing device 202.

Figure 4:
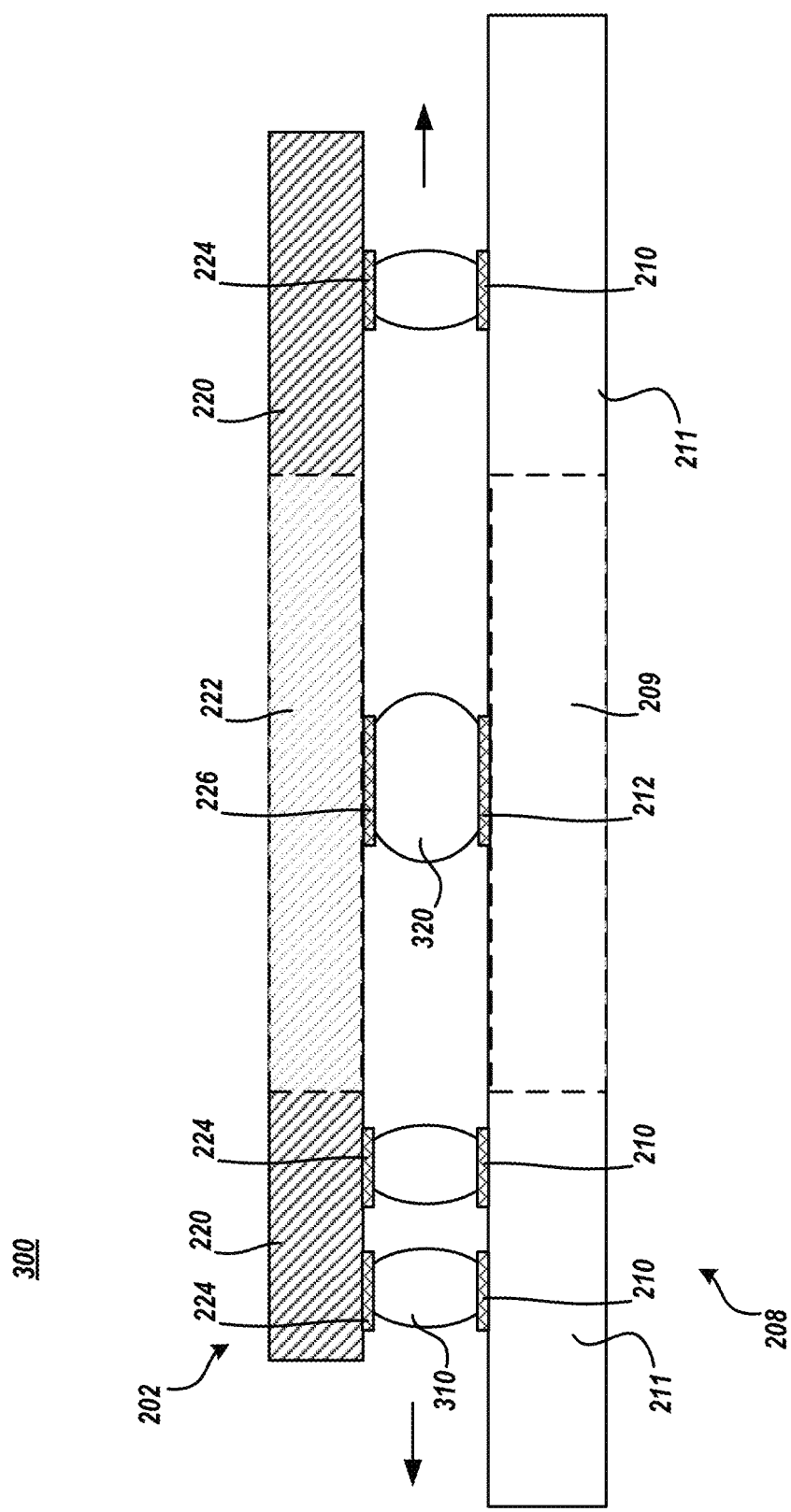
FIG. 4 depicts a side view of an electronic package, according to one or more embodiments of the present invention.

FIG. 4 depicts a side view of an electronic package 300, according to one or more embodiments of the present invention. Electronic package 300 includes processing device 202 and interposer 208 that are connected (e.g., electrically connected, etc.) by one or more solder interconnects 320 and by one or more solder interconnects 310. Electronic package 300 may be utilized in place of electronic package 124 within system 100.

Processing device 202 includes one or more electrically conductive contacts 224, 226 and interposer includes one or more electrically conductive contacts 210, 212. Contact 212 and contact 226 may also be referred herein, collectively or singularly, as contact(s) 360. Contacts 360 include both a minor axis and a major axis and are positioned upon the processing device 202 or the interposer 208, respectively, such that the major axis is generally aligned with the direction of expansion of the interposer 208 or the processing device 202. The contact 226 of the processing device 202 may be aligned with contact 212 of the interposer 208 such that when an solder interconnect 320 is positioned therebetween (and reflowed) the contact 226 is electrically connected to contact 212. Contact 224 and contact 210 may also be referred herein, collectively or singularly, as contact(s) 350. Contacts 350 include diameter axes. The contact 224 of the processing device 202 may be aligned with contact 210 of the interposer 208 such that when an solder interconnect 310 is positioned therebetween (and reflowed) the contact 224 is electrically connected to contact 210.

Subsequent to solder reflow, the solder interconnect 320 takes the shape of the contact 226 and the contact 212 at the contact 226, 212 and solder interconnect 320 interface. Therefore, after solder reflow, the solder interconnect 320 top surface has a major axis and minor axis and the solder interconnect bottom surface also has a major axis and minor axis. Solder interconnect 320 may be a C4 type solder, solder sphere, micro solder sphere, or the like. The position of contacts 360 is such that the major axis of the contacts 360 is aligned with the direction of expansion of processing device 202 and/or interposer 208. Therefore, subsequent to solder reflow, a maximum solder width of solder interconnect 320 is also aligned with the direction of expansion of processing device 202 and/or interposer 208.

Likewise, subsequent to solder reflow, the solder interconnect 310 takes the shape of the contact 224 and the contact 210 at the contact 224, 210 and solder interconnect 310 interface. Therefore, after solder reflow, the solder interconnect 310 top surface has diameter axes and solder interconnect 310 bottom surface also has diameter axes. Solder interconnect 310 may be a C4 type solder, solder sphere, micro solder sphere, or the like. The position of contacts 350 and the dimension between contact 224 and contact 210 may be such that, subsequent to solder reflow, a solder height of the solder interconnect 310 is orthogonal to the direction of expansion of the processing device 202.

The heating of the electronic package 300 results in the physical or dimensional expansion of the processing device 202 and the interposer 208. Typically, the processing device 202 and the interposer 208 do not expand uniformly. The expansion differences are generally due to the interposer 208 having a larger coefficient of thermal expansion (CTE) relative to the processing device 202 and result in the processing device 202 expanding less relative to the interposer 208. The relative movement between the processing device 202 and interposer 208 results in stresses within the solder interconnects 310, 320. Therefore, it may be advantageous to reduce the relative movement between the processing device 202 and interposer 208 to reduce the stresses within the solder interconnects 310, 320. Thus, it is an object of one or more embodiments to align a major axis of a contact 226 and or contact 212 with the direction of expansion of the interposer 208 and/or the processing device 202 so as to form major axis upon the top and/or bottom surfaces of the solder interconnect 320 that are also aligned with the direction of expansion of the interposer 208 and/or the processing device 202 to restrict relative movement between interposer 208 and processing device 202. The reduction of relative movement between interposer 208 and processing device 202 reduces the resulting stresses within both the solder interconnect 310 and solder interconnect 320. In other words, by utilizing solder interconnect 320 having a major axis upon the top and/or bottom surfaces that is aligned with the direction of expansion, stress is reduced in solder interconnects 310.

In embodiments where solder interconnect 310 electrically connects a contact 210 with a contact 224 located within IO region 220 of processing device 202 and where solder interconnect 320 electrically connects a contact 212 with a contact 226 located within power ground region 222 of processing device 202, the reduction of relative movement between interposer 208 and processing device 202 caused by the aligned solder interconnect 320 reduces the stresses within that solder interconnect 310 a greater amount relative to the stresses within the solder interconnect 320. Likewise in embodiments where solder interconnect 310 electrically connects a contact 210 with a contact 224 located within the perimeter region of processing device 202 and where solder interconnect 320 electrically connects a contact 212 with a contact 226 located within the quintain of processing device 202, the reduction of relative movement between interposer 208 and processing device 202 caused by the aligned solder interconnect 320 reduces the stresses within that solder interconnect 310 a greater amount relative to the stresses within the solder interconnect 320.

In one or more embodiments, as is exemplary shown in FIG. 4, subsequent to solder reflow, a solder height of solder interconnect 310 may be orthogonal to a solder width of solder interconnect 310 and a solder height of solder interconnect 320 may be orthogonal to a solder width of solder interconnect 320. (Please remove this as the previous sentence is not always true. The solder width of the interconnect 320 depends on where the section is taken and could be higher or lower than the solder width of the interconnect 310)

Interposer 208 may comprise a power/ground region 209 and IO region 211. The one or more electrical contacts 212 having a major axis and minor axis may be located within power/ground region 209. The one or more electrical contacts 210 have diameter axes may be located within IO region 211. IO region 211 of interposer 208 is the location(s) of interposer 208 that which the electronic communication signal is received from or is transferred to by processing device 202. Power/ground region 209 of interposer 208 is the location(s) of interposer 208 that which a reference power signal or reference ground signal are received by processing device 202.

Figure 5:
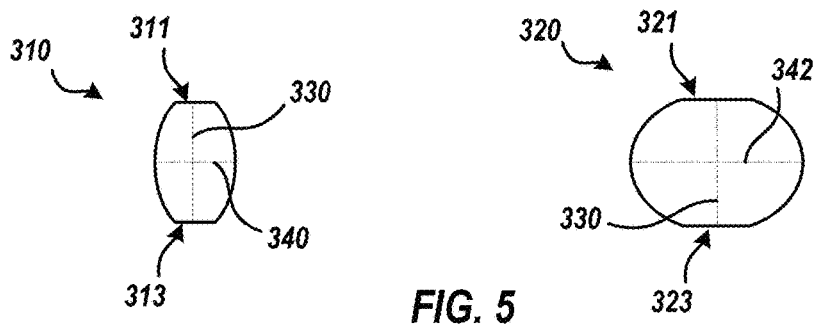
FIG. 5 depicts a side view of solder interconnects, according to one or more embodiments of the present invention.

FIG. 5 depicts a side cross sectional view of reflowed solder interconnect 310 and reflowed solder interconnect 320, according to one or more embodiments of the present invention.

Solder interconnect 320 has a major axis and minor axis upon the top surface 321 of the solder interconnect 320 at the interface between the solder interconnect and a respective contact 360 that is coincident with the major axis and minor axis of the contact 360, respectively. Likewise, solder interconnect 320 may have a major axis and minor axis upon the bottom surface 323 of the solder interconnect 320 at the interface between the solder interconnect and the other contact 360 that is coincident with the major axis and minor axis of the other contact 360, respectively. Therefore the major axis upon the top surface 321 and the major axis upon the bottom surface 323 are aligned with the direction of expansion of processing device 202 and/or interposer 208. The alignment of these major axes generally restricts relative movement between interposer 208 and processing device 202. In an embodiment, the maximum width 342 of contact 320 may also be aligned with the direction of expansion of interposer 208 and/or processing device 202.

As a further result of the reflow, solder interconnect 320 may further include a solder height 330 which may have a length equal to the space between contacts 360. In an embodiment the solder width 342 of interconnect 320 is greater than solder height 330 of interconnect 320. In another embodiment, the solder width 342 of interconnect 320 is less than or equal to solder height 330 of interconnect 320.

In one or more embodiments, subsequent to solder reflow, a solder height 330 of solder interconnect 310 may have the same length as and may be parallel with the solder height 330 of interconnect 320. In an embodiment, solder width 340 of interconnect 310 is less than solder height 330 of interconnect 310. In another embodiment, the solder width 340 of interconnect 310 is greater than or equal to solder height 330 of interconnect 310.

Figure 6:
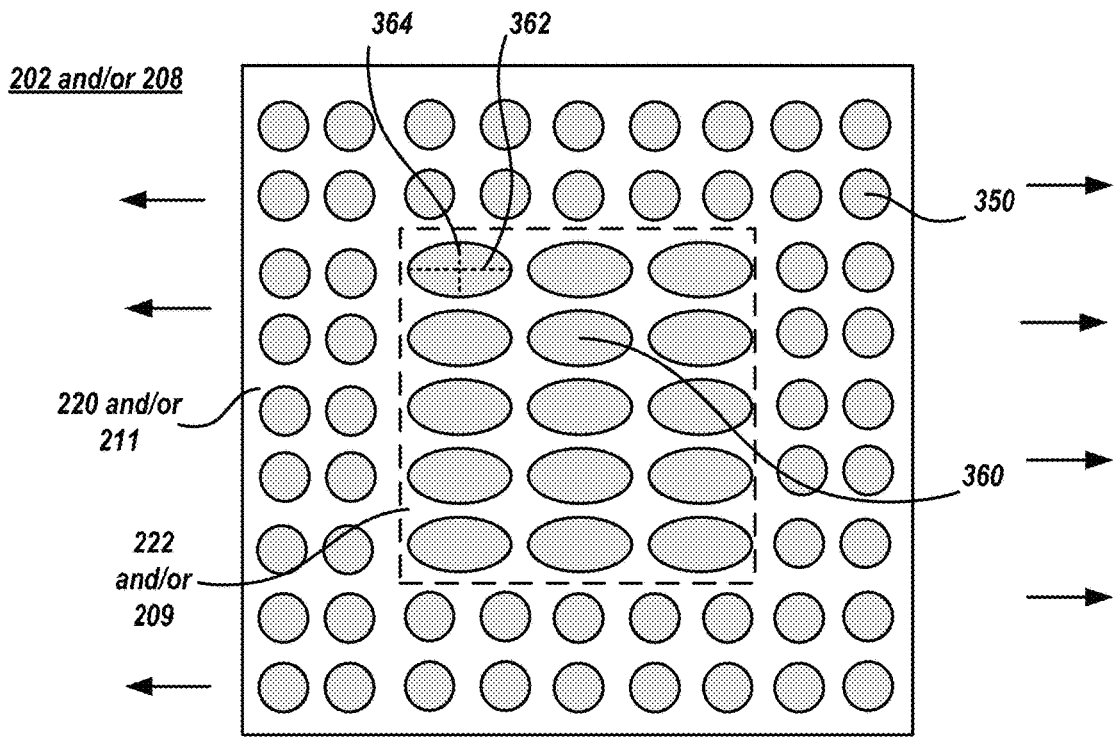
FIG. 6 depicts a normal view of an electrical contact grid, according to one or more embodiments of the present invention.

FIG. 6 depicts a normal view of an electrical contact grid, according to one or more embodiments of the present invention. For example, FIG. 6 depicts a top side or bottom side view of processing device 202 or a bottom side or top side of interposer 208. The one or more electrical contacts 360 having a major axis 362 and minor axis 362 may be located within power/ground region 209 and/or 222. The one or more electrical contacts 350 having diameter axes may be located within IO region 211 and/or 220. The contacts 360 may be located within power/ground region 209 and/or 222 which is completely surrounded by IO region 211 and/or 220. The position of contacts 360 may be such that the major axis 362 of the contacts 360 are aligned with the direction of expansion of processing device 202 and/or interposer 208. Therefore, subsequent to solder reflow, the coincident major axis or axes of solder interconnect 320 will also be aligned with the direction of expansion of processing device 202 and/or interposer 208.

Figure 7:
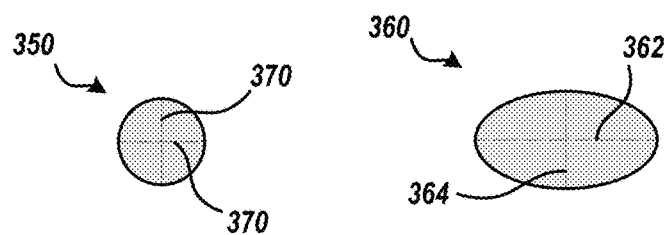
FIG. 7 depicts a normal view of electrical contacts, according to one or more embodiments of the present invention.

FIG. 7 depicts a normal view of electrical contacts, according to one or more embodiments of the present invention. For example, FIG. 7 depicts an electrical contact 350 top or bottom surface and electrical contact 360 top or bottom surface. Electrical contacts 360 includes a major axis 362 and a minor axis 364. The major axis 362 and the minor axis 364 are generally located upon the surface of the electrical contact 360 opposite of the surface of electrical contact 360 that is connected to the processing device 202 or the interposer 208, respectively. Electrical contact 350 includes numerous diameter axes 370. The diameter axes 370 are generally located upon the surface of the electrical contact 350 opposite of the surface of electrical contact 350 that is connected to the processing device 202 or the interposer 208, respectively. The processing device 202 (not shown in FIG. 7) and/or the interposer 208 (not shown in FIG. 7) includes one or more contacts 360 that are positioned such that the major axis 362 is generally aligned with the direction of expansion of the interposer 208 or the processing device 202. The term "aligned" or the like means within plus or minus ten degrees of a reference direction. For example, contact 360 is positioned such that the major axis 362 is within plus or minus ten degrees from the direction of expansion of the interposer 208 or the processing device 202.

The contact 360 of the processing device 202 may be aligned with contact 360 of the interposer 208 such that when an solder interconnect is positioned therebetween (and reflowed) the contacts 360 are electrically connected. Subsequent to solder reflow, the solder interconnect 320 (shown e.g., in FIG. 5) takes the shape of the surface of contact 360 at the contact 360 and solder interconnect interface. Therefore, after solder reflow, the solder interconnect 320 top surface 321 may have a major axis and minor axis that are coincident with the major axis 362 and minor axis 364 of contact 360, respectively. Similarly, the solder interconnect 320 bottom surface 323 may also has a major axis and minor axis 330 that are coincident with the major axis 362 and minor axis 364 of contact 360, respectively. Likewise, subsequent to solder reflow, solder interconnect 310 (shown e.g., in FIG. 5) takes the shape of the contact 350 at the contact 350 and solder interconnect 310 interface. Therefore, after solder reflow, the solder interconnect top surface 311 has diameter axes and solder interconnect bottom surface 313 also has diameter axes.

The coincident major axis or axes of solder interconnect 320 as a result of the major axis or axes 362 of contact(s) 360 generally restricts relative movement between interposer 208 and processing device 202 better than a shorter axis of a solder interconnect that is aligned therewith. In an embodiment, an aspect ratio between the length of major axis 362 and the length of minor axis 364 may range from 1.1-2.5.

Figure 8:
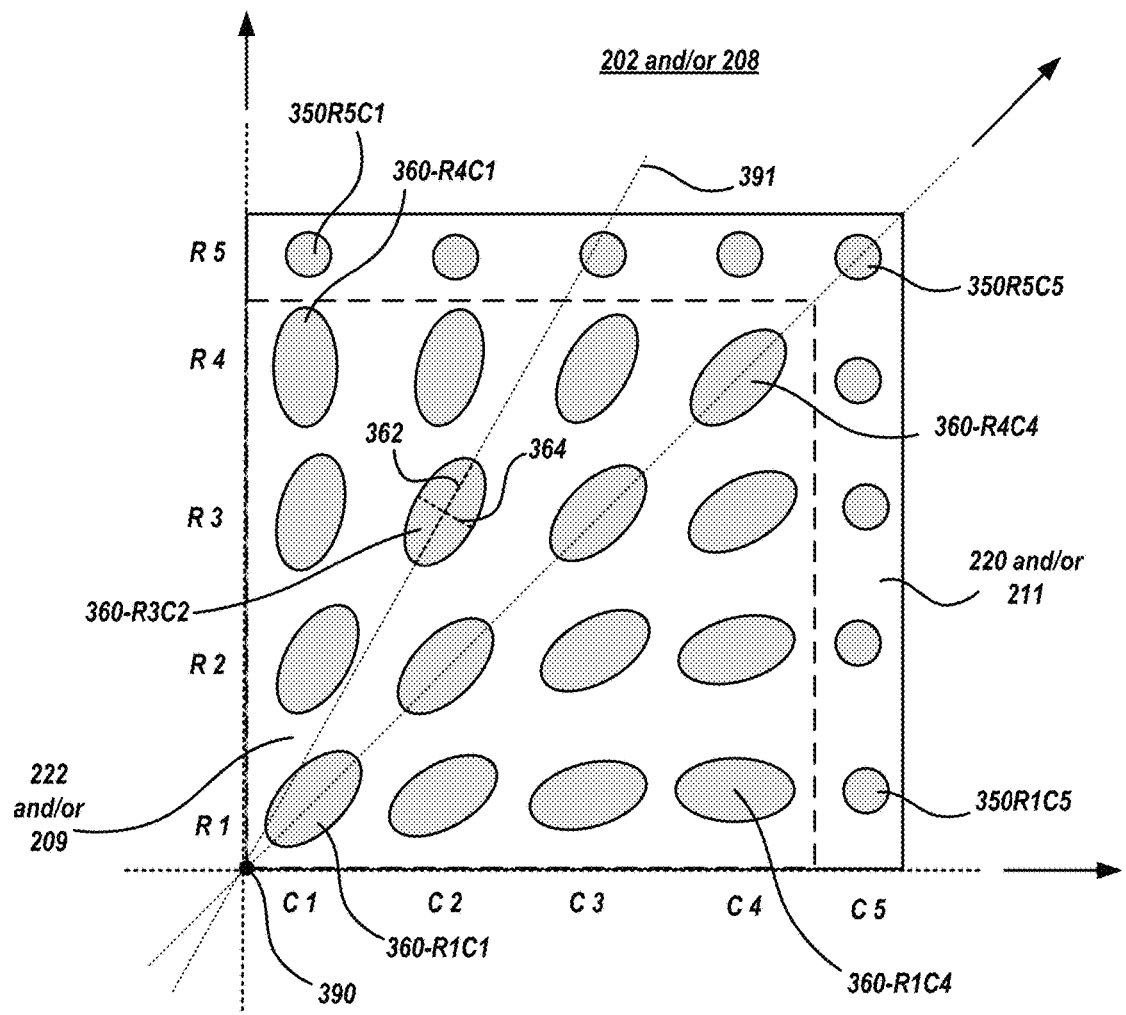
FIG. 8 depicts a normal view of a quartered electrical contact grid, according to one or more embodiments of the present invention.

FIG. 8 depicts a normal view of a quartered electrical contact grid upon a processing device 202 and/or interposer 208, according to one or more embodiments of the present invention. The quartered electrical contact grid includes contacts arranged in a row and column matrix. There are rows of contacts R1-R5 and columns of contacts C1-C5.

When processing device 202 and/or interposer 208 expands generally concentrically about its respective center 390 (i.e. depicted as the lower left corner of processing device 202 and/or interposer 208) each of the numerous contacts 360 may be positioned such that the major axis 362 of each contact 360 is aligned with a reference line created from the center 390 of and the intersection of major axis 362 and minor axis 364 that contact 360. For example, contact 360-C2R3 is positioned such that its major axis 362 is aligned with reference line 391 which connects center 390 and the intersection of contact 360-C2R3 major axis 362 and minor axis 364.

In an embodiment, each contact 360 within a particular row or a particular column may be rotated relative to a neighboring contact 360 within that same row or same column. For example, contact 360-R1C2 is rotated relative to contact 360-R1C1, contact 360-R1C3 is rotated relative to contact 360-R1C2, and contact 360-R1C4 is rotated relative to contact 360-R1C3. Similarly, contact 360-R2C1 is rotated relative to contact 360-R1C1, contact 360-R3C1 is rotated relative to contact 360-R2C1, and contact 360-R4C1 is rotated relative to contact 360-R3C1. The direction of rotation of each contact 360 within a particular row or a particular column may be the same direction.

Figure 9:
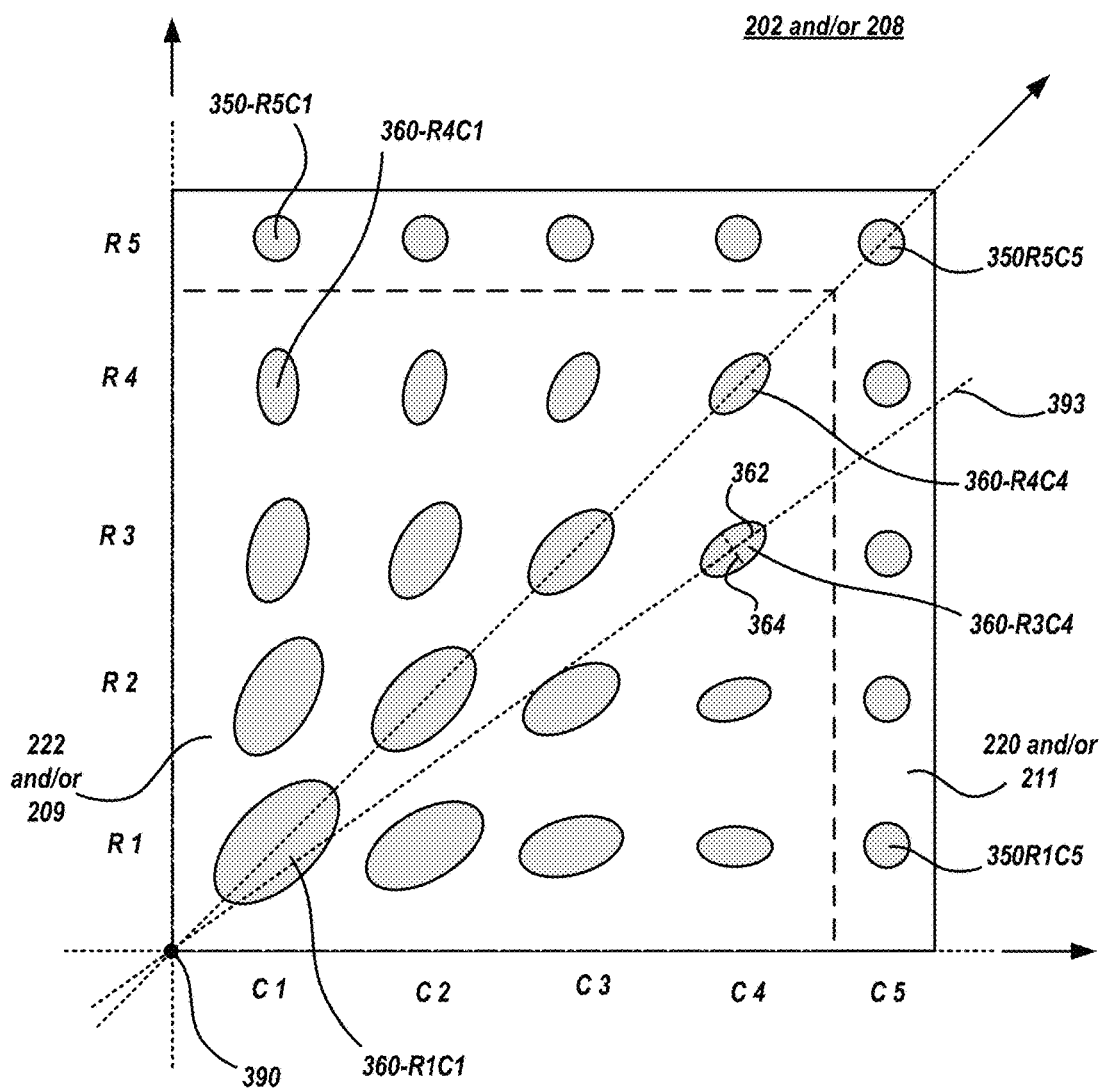
FIG. 9 depicts a normal view of a quartered electrical contact grid, according to one or more embodiments of the present invention.

FIG. 9 depicts a normal view of a quartered electrical contact grid upon a processing device 202 and/or interposer 208, according to one or more embodiments of the present invention. The quartered electrical contact grid includes contacts of various size arranged in a row and column matrix. There are rows of contacts R1-R5 and columns of contacts C1-C5.

When processing device 202 and/or interposer 208 expands generally concentrically about its respective center 390 one or more of the numerous contacts 360 may be positioned such that the major axis 362 of the one or more contacts 360 is aligned with a reference line created from the center 390 of and the intersection of major axis 362 and minor axis 364 that contact 360. For example, contact 360-R3C4 is positioned such that its major axis 362 is aligned with reference line 393 which connects center 390 and the intersection of contact 360-R3C4 major axis 362 and minor axis 364.

In an embodiment, each contact 360 within a particular row or a particular column may have a different surface area (i.e. the surface associated with major axis 362 and minor axis 364) relative to a neighboring contact 360 within that same row or same column. For example, contact 360-R1C2 has a smaller surface area relative to contact 360-R1C1, contact 360-R1C3 has a smaller surface area relative to contact 360-R1C2, and contact 360-R1C4 has a smaller surface area relative to contact 360-R1C3. Similarly, contact 360-R2C1 has a smaller surface area relative to contact 360-R1C1, contact 360-R3C1 has a smaller surface area relative to contact 360-R2C1, and contact 360-R4C1 has a smaller surface area relative to contact 360-R3C1. The contact 360 neighboring a contact 350 may have the same surface area as contact 350. Alternatively, the contact 360 neighboring a contact 350 may have surface area that is larger than (e.g., 20% larger, etc.) the surface area of contact 350. In other words, the contact 360 neighboring a contact 350 may have approximately the same surface areas. For example, contact 360-R4C4 has approximately the same surface area as contact 350-R5C5, contact 360-R4C1 has approximately the same surface area as contact 350-R5C1, and contact 360-14C4 has approximately the same surface area as contact 350-R105.

In an embodiment, each contact 360 within a particular row or a particular column may have a different aspect ratio relative to a neighboring contact 360 within that same row or same column. For example, the contact 360 nearest center 390 may have the largest aspect ratio and the contacts 360 positioned iteratively away therefrom may have smaller and smaller aspect ratios, respectively. In an embodiment, each contact within a particular ring away from center 390 may have the same aspect ratio and/or surface area. For example, contacts 360-R3C1, 360-R3C2, 360-R3C3, 360-R2C3, and 360-R1C3 may have the same aspect ratio and/or surface area.

Figure 10:
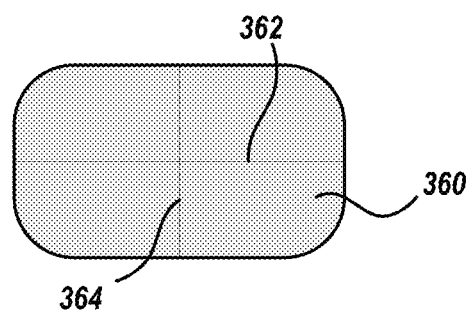
FIG. 10 depicts a normal view of an electrical contact, according to one or more embodiments of the present invention.

FIG. 10 depicts a normal view of an electrical contact 360, according to one or more embodiments of the present invention. FIG. 10 depicts an alternative shape of electrical contact 360 which includes a major axis 362 and minor axis 364. For example, FIG. 10 depicts solder interconnect 360 top or bottom surface. Whereas previous Figures depicted electrical contact 360 being of elliptical shape, electrical contact 360 may be any shape which includes a major axis 362 and a minor axis 364. For example, electrical contact 360 may have a rectangle top or bottom surface, rounded rectangle top or bottom surface, as is depicted in FIG. 10, or the like. The major axis 362 and the minor axis 364 are generally located upon the surface of the electrical contact 360 opposite of the surface of electrical contact 360 that is connected to the processing device 202 or the interposer 208, respectively. In some embodiments, processing device 202 or the interposer 208 may include various shaped electrical contacts 360. For example, processing device 202 or the interposer 208 may include a first electrical contact 360 with a rounded rectangle top or bottom surface and a second electrical contact 360 with an elliptical top or bottom surface.

Figure 11:
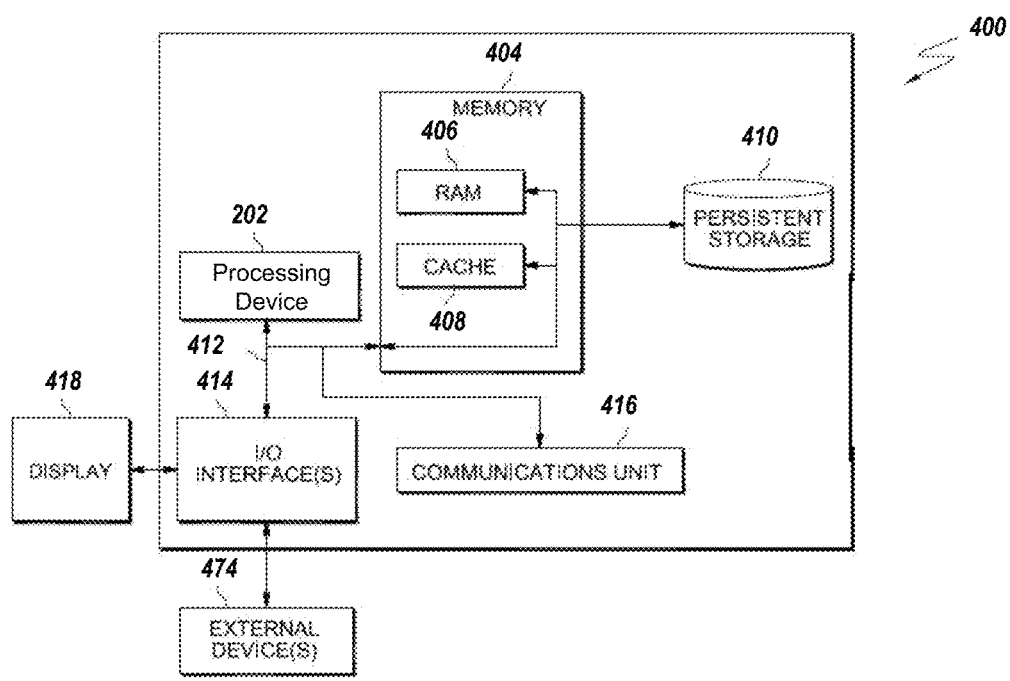
FIG. 11 depicts a block diagram of an electronic device that may utilized one or more embodiments of the present invention.

FIG. 11 depicts a block diagram of an electronic device 300 that may utilize various embodiments of the present invention. It should be appreciated that FIG. 11 provides only an illustration of one implementation of electronic device 300 that utilizes a processing device 202 and/or interposer 208 which includes one or more contacts 360, respectively, positioned such that the major axis 362 of the contact(s) 260 are aligned with the direction of expansion of the respective processing device 202 and/or interposer 208.

Electronic device 300 includes communications bus 412, which provides communications between processing device 202, memory 404, persistent storage 410, communications unit 416, and input/output (I/O) interface(s) 414. Processing device 202 may call program instructions stored in memory 404 as is known in the art. Memory 404 may be, for example, one or more random access memories (RAM) 406, cache memory 408, or any other suitable non-volatile or volatile storage device. Persistent storage 410 can include one or more of flash memory, magnetic disk storage device of an internal hard drive, a solid state drive, a semiconductor storage device, read-only memory (ROM), EPROM, or any other computer-readable tangible storage device that is capable of storing program instructions or digital information.

The media used by persistent storage 410 may also be removable. For example, a removable hard drive may be used for persistent storage 410. Other examples include an optical or magnetic disk that is inserted into a drive for transfer onto another storage device that is also a part of persistent storage 410, or other removable storage devices such as a thumb drive or smart card.

Communications unit 416 provides for communications with other electronic devices. Communications unit 416 includes one or more network interfaces. Communications unit 416 may provide communications through the use of either or both physical and wireless communications links. In other embodiments, electronic device 400 may be devoid of communications unit 416. Software may be downloaded to persistent storage 410 through communications unit 416.

I/O interface(s) 414 allows for input and output of data with other devices that may be connected to electronic device 400. I/O interface 414 may further provide a connection to other external devices such as a camera, mouse, keyboard, keypad, touch screen, and/or some other suitable input device. I/O interface(s) 414 may also connect to display 418.

Display 418 provides a mechanism to display data to a user and may be, for example, a computer monitor. Alternatively, display 418 may be integral to electronic device 400 and may also function as a touch screen.

FIG. 12A and FIG. 12B depict an electronic package structure at a particular stage of fabrication, according to one or more embodiments of the present invention. FIG. 12A depicts a side view and FIG. 12B depicts a top view of a processing device 202 or interposer 208. The particular stage of fabrication may be an initial stage of fabrication where a processing device 202 or interposer 208 is provided.

FIG. 13A and FIG. 13B depict an electronic package structure at a subsequent stage of fabrication, according to one or more embodiments of the present invention. FIG. 13A depicts a side view and FIG. 13B depicts a top view of a processing device 202 or interposer 208. At the present stage of fabrication, a mask 500 is formed upon the processing device 202 or interposer 208.

Prior to the formation of mask 500, a shorting layer 501 may be formed upon the processing device 202 or interposer 208 using a sputtering technique or other known deposition technique. In embodiments, the shorting layer 501 may be, for example, copper or other conductive metal such as, for example, nickel, nickel alloys, copper alloys, etc. The shorting layer 501 may be multilayered and further include a barrier layer which may be, for example, Titanium, Titanium Tungsten, or Titanium Tungsten Chrome. The shorting layer 501 may be about 0.45 microns thick; although other dimensions are also contemplated by the present invention such as, for example, a range of about between 0.1 to 0.6 microns. In certain embodiments, shorting layer 501 is utilized as an electrically conductive layer where a plating tool electrically contacts processing device 202 or interposer 208 to enable the formation of contacts by plating.

Figure 14A:
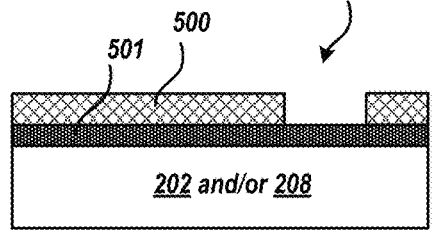
FIG. 14A and FIG. 14B depict an electronic package structure at a subsequent stage of fabrication, according to one or more embodiments of the present invention.
Figure 14B:
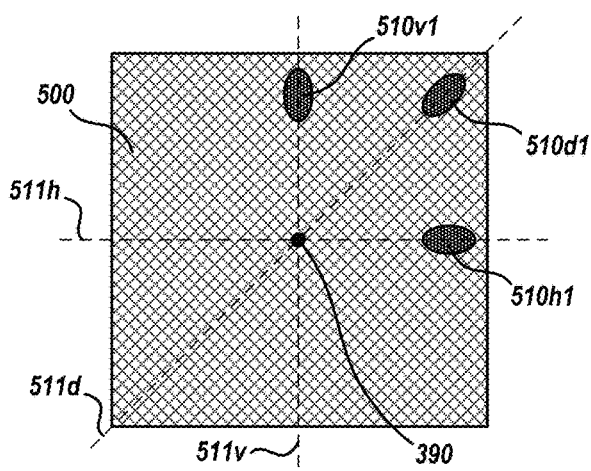

Mask 500 may be a known mask material such as a photoresist that may be patterned formed upon the shorting layer 501. Mask 500 may be applied as a liquid upon shorting layer 501 that may dry and be patterned, as is shown in FIG. 14A and FIG. 14B, generally forming trenches 510 within the mask 500 that expose portions of the shorting layer 501. For example, when mask 500 is a photoresist, a liquid photoresist may be formed by precision spraying, roller coating, dip coating, spin coating, etc. Exemplary liquid photoresists can be either positive or negative tone resists. Mask 500 may also be a semi-solid film coated, laminated, or otherwise formed upon shorting layer 501. Mask 500 may be a dry photoresist and is of sufficient thickness to form desired contact structures. As such, mask 500 may be chosen to be of a material and a thickness to satisfy such requirements. Perimeter portions of shorting layer 501 may be left uncovered by mask 500 forming electrically conductive perimeter regions.

FIG. 14A and FIG. 14B depict an electronic package structure at a subsequent stage of fabrication, according to one or more embodiments of the present invention. FIG. 14A depicts a side view and FIG. 14B depicts a top view of a processing device 202 or interposer 208. At the present stage of fabrication, mask 500 is patterned forming trenches 510.

A pattern may be formed in the mask 500 by removing portions of the mask 500. For example, when mask 500 is a photoresist, portions of the mask 500 may be exposed to radiation such as deep ultraviolet light or electron beams. Once the patterning of mask 500 is completed, portions of the mask 500 may be retained and portions of mask 500 may be etched away by an etchant that removes mask 500 material. The portions of mask 500 that are etched away reveal the underlying shorting layer 501. In various embodiments, the portions of mask 500 that are etched away form trenches 510 in which electrically conductive material(s) may be plated within.

Trenches 510 generally have the intended final shape as contacts 360. As such, trenches also have a major axis and minor axis. A particular trench 510$h$1 is positioned within mask 500 such that the major axis of trench 510$h$1 is aligned with reference line 511$h$ created from the center 390 of processing device 202 or interposer 208 and the intersection of the major axis and minor axis of trench 510$h$1. Reference line 511$h$ may be horizontal. A particular trench 510$v$1 is positioned within mask 500 such that the major axis of trench 510$v$1 is aligned with reference line 511$v$ created from the center 390 of processing device 202 or interposer 208 and the intersection of the major axis and minor axis of trench 510$v$1. Reference line 511$v$ may be orthogonal to reference line 511$h$. A particular trench 510$d$1 is positioned within mask 500 such that the major axis of trench 510$d$1 is aligned with reference line 511$d$ created from the center 390 of processing device 202 or interposer 208 and the intersection of the major axis and minor axis of trench 510$d$1. Reference line 511$d$ is forty five degrees between reference line 511$h$ and reference line 511$v$. Reference lines 511$d$, 511$h$ and 511$v$ are generally in the same plane.

Figure 15:
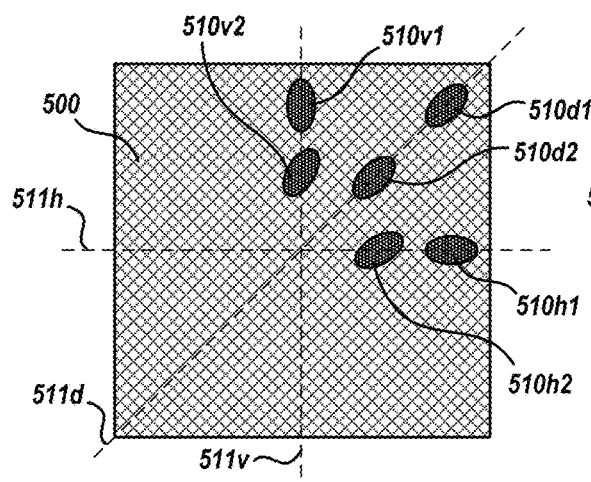
FIG. 15 depicts an electronic package structure at a subsequent stage of fabrication, according to one or more embodiments of the present invention.

FIG. 15 depicts an electronic package structure at a subsequent stage of fabrication, according to one or more embodiments of the present invention. At the present stage of fabrication, additional trenches 510 are formed within mask 500. For clarity, multiple trenches 510 may be formed in a single trench fabrication stage without requiring multiple trench fabrication stages to form additional trenches 510.

In a first embodiment, a particular trench 510$h$2 is positioned within mask 500 such that the major axis of trench 510$h$2 is aligned with reference line 511$h$, particular trench 510$v$2 is positioned within mask 500 such that the major axis of trench 510$v$2 is aligned with reference line 511$v$, and particular trench 510$d$2 is positioned within mask 500 such that the major axis of trench 510$d$1 is aligned with reference line 511$d$.

In an alternative embodiment, as is shown in FIG. 15, trench 510$h$2 is positioned within mask 500 such that the major axis and minor axis intersection of trench 510$h$2 is aligned upon reference line 511$h$ and is rotated relative to trench 510$h$1, trench 510$v$2 is positioned within mask 500 such that the major axis and minor axis intersection of trench 510$v$2 is aligned upon reference line 511$v$ and is rotated relative to trench 510$v$1, and trench 510$d$2 is positioned within mask 500 such that the major axis is aligned upon reference line 511$d$. The direction of rotation referred to in this paragraph may be toward reference line 511$d$.

Figure 16:
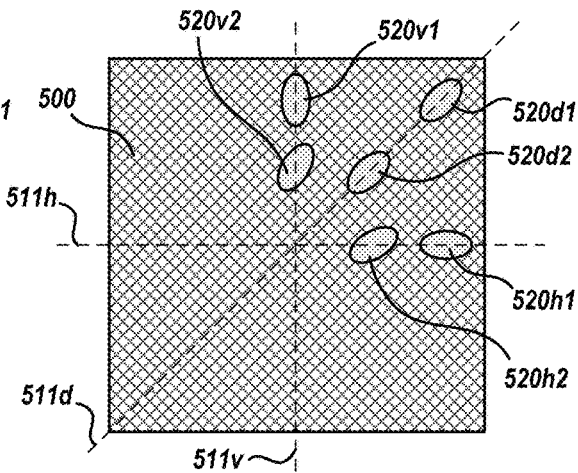
FIG. 16 depicts an electronic package structure at a subsequent stage of fabrication, according to one or more embodiments of the present invention.

FIG. 16 depicts an electronic package structure at a subsequent stage of fabrication, according to one or more embodiments of the present invention. At the present stage of fabrication, electrically conductive material is formed within trenches 510 forming contacts 360.

Contacts 360 may be formed utilizing a plating tool. Plating, electroplating, electrodeposition, etc. is a process in which processing device 202 or interposer 208 is placed in a reservoir which contains a plating solution (e.g. plating bath, etc.). The processing device 202 or interposer 208 may be attached to a fixture that accepts processing device 202 or interposer 208 and contacts electrically conductive perimeter region such that only the shorting layer 501 within trenches 510 are exposed to the plating solution. An electrical circuit is created when a negative terminal of a power supply contacts electrically conductive perimeter region of processing device 202 or interposer 208 so as to form a cathode and a positive terminal of the power supply is connected to plating material in the tool so as to form an anode.

The plating material may be a stabilized metal specie in the plating solution. During the plating process, when an electrical current is passed through the circuit, this metal specie is dissolved in the solution which take-up electrons forming electrically conductive material upon the exposed shorting layer 501 within trenches 510. In a particular embodiment, the plating material may be, for example, copper (Cu). In an exemplary Cu plating process, in a sulfate solution, copper is oxidized at the anode to $Cu^{2+}$ by losing two electrons. The $Cu^{2+}$ associates with $SO_4^{2-}$ in the solution to form copper sulfate. At the cathode, the $Cu^{2+}$ is reduced to metallic Cu by gaining two electrons.

Figure 17:
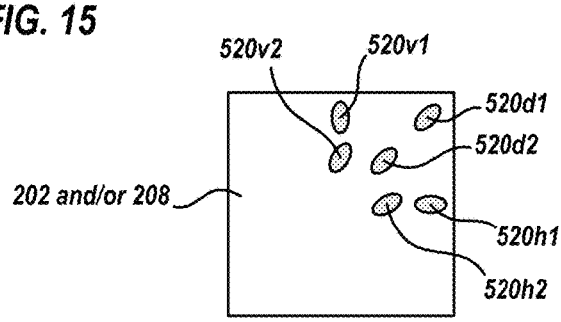
FIG. 17 depicts an electronic package structure at a subsequent stage of fabrication, according to one or more embodiments of the present invention.

FIG. 17 depicts an electronic package structure at a subsequent stage of fabrication, according to one or more embodiments of the present invention. At the present stage of fabrication, mask 500 is removed from processing device 202 or interposer 208. Mask 500 may be removed by a mask removing solution within e.g., a photoresist removal tool reservoir that removes mask 500. A subsequent fabrication stage may remove the shorting layer generally external from the side surfaces of the contacts.

Figure 18:
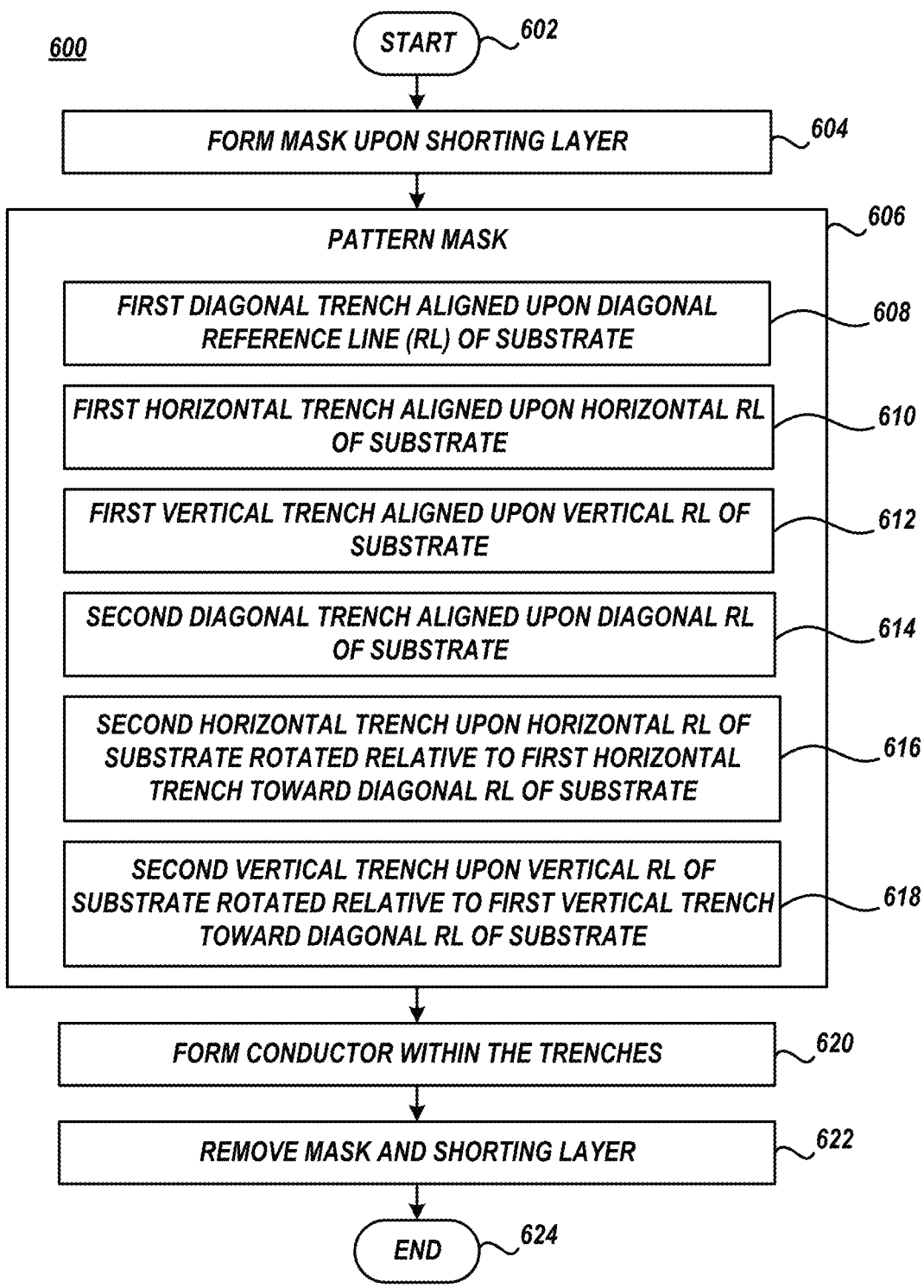
FIG. 18 depicts a method of fabricating an electronic package structure, according to embodiments of the present invention.

FIG. 18 depicts a method 600 of fabricating an electronic package structure, such as a processing device 202 or interposer 208, according to embodiments of the present invention. Method 600 may be utilized by a fabricator of a wafer, processing device, interposer, or the like. Method 600 begins at block 602 and continues with forming mask 500 upon a shorting layer 501 (block 604).

The shorting layer 501 may be located upon the processing device 202 or interposer 208 and may be formed by a sputtering technique or other known deposition technique. In embodiments, the shorting layer 501 may be, for example, copper or other conductive metal such as, for example, nickel, nickel alloys, copper alloys, etc. The shorting layer 501 may be multilayered and further include a barrier layer which may be, for example, Titanium, Titanium Tungsten, or Titanium Tungsten Chrome. In certain embodiments, shorting layer 501 is utilized as a conductive layer where a plating tool electrically contacts the shorting layer to enable the plating of contacts 360, 350, or the like. Perimeter portions of shorting layer 501 may be left uncovered by mask 500 forming electrically conductive perimeter regions.

Method 600 may continue with patterning mask 500 to form trenches 510 (block 606). A pattern may be formed in the mask 500 by removing portions of the mask 500. For example, when mask 500 is a photoresist, portions of the mask 500 may be exposed to radiation such as deep ultraviolet light or electron beams. Once the patterning of mask 500 is completed, portions of the mask 500 may be retained and portions of mask 500 may be etched away by an etchant that removes mask 500 material. The portions of mask 500 that are etched away reveal the underlying shorting layer 501. In various embodiments, the portions of mask 500 that are etched away form trenches 510 in which electrically conductive material(s) may be plated within.

Trenches 510 generally have the intended final shape as contacts 360. As such, trenches also have a major axis and minor axis. A first horizontal trench is positioned within mask 500 such that the major axis of the first horizontal trench is aligned with a horizontal reference line at the center 390 of processing device 202 or interposer 208 (block 610). A first vertical trench is positioned within mask 500 such that the major axis the first vertical trench is aligned with a vertical reference line at the center 390 of processing device 202 or interposer 208 (block 612). A first diagonal trench is positioned within mask 500 such that the major axis of the first diagonal trench is aligned with a diagonal reference line at the center 390 of processing device 202 or interposer 208 (block 608). The diagonal reference line is forty five degrees between the horizontal and vertical reference lines. The center 390 and the vertical, horizontal, and diagonal reference lines are generally in the same plane.

In an embodiment, a second horizontal trench is positioned within mask 500 such that the major axis of the second horizontal trench is aligned with the horizontal reference line, a second vertical trench is positioned within mask 500 such that the major axis of the second vertical trench is aligned with the vertical reference line, and a second diagonal trench is positioned within mask 500 such that the major axis of second diagonal trench is aligned with the diagonal reference line.

In an alternative embodiment, the second horizontal trench is positioned within mask 500 such that the major axis and minor axis intersection of second horizontal trench is aligned upon the horizontal reference line and is rotated relative to the first horizontal trench (block 616), the second vertical trench is positioned within mask 500 such that the major axis and minor axis intersection of the second vertical trench is aligned upon the vertical reference line and is rotated relative to the first vertical trench (block 618), and the second diagonal trench is positioned within mask 500 such that the major axis of the second diagonal trench is aligned upon the diagonal reference line (block 614). The direction of rotation referred to in this paragraph may be toward the diagonal reference line. The vertical, horizontal, and/or diagonal reference lines referred to in method 600 may be respective bisectors of the electronic package structure.

Method 600 may continue with forming contacts by forming electrically conductive material within trenches 510 (block 620). Contacts 360 may be formed by plating techniques such as, electroplating, electrodeposition, etc. To plate contacts 360, processing device 202 or interposer 208 is placed in a plating tool reservoir which contains a plating solution (e.g. plating bath, etc.). The processing device 202 or interposer 208 may be attached to a fixture that accepts processing device 202 or interposer 208 and contacts electrically conductive perimeter region such that only the shorting layer 501 within trenches 510 are exposed to the plating solution. An electrical circuit is created when a negative terminal of a power supply contacts electrically conductive perimeter region of processing device 202 or interposer 208 so as to form a cathode and a positive terminal of the power supply is connected to plating material in the tool so as to form an anode. The plating material may be a stabilized metal specie in the plating solution. During the plating process, when an electrical current is passed through the circuit, this metal specie is dissolved in the solution which take-up electrons forming electrically conductive material upon the exposed shorting layer 501 within trenches 510. In a particular embodiment, the plating material may be, for example, copper (Cu). In an exemplary Cu plating process, in a sulfate solution, copper is oxidized at the anode to $Cu^{2+}$ by losing two electrons. The $Cu^{2+}$ associates with $SO_4^{2-}$ in the solution to form copper sulfate. At the cathode, the $Cu^{2+}$ is reduced to metallic Cu by gaining two electrons.

Method 600 may continue with removing mask 500 and removing the shorting layer 501 external to the formed contacts (block 622). Mask 500 may be removed by a mask removing solution within e.g., a photoresist removal tool reservoir that removes the photoresist mask 500. The shorting layer 501 may be removed external to the formed contacts to expose the underlying layer of processing device 202 or interposer 208 that which the shorting layer 501 was formed upon. The shorting layer 501 may be selectively removed by known subtractive removal techniques. In embodiments, further contact trenches may be formed utilizing techniques described herein such that each of the further contact trenches that each have diameter axes. Contacts 350 may be formed therewithin and may be located in IO region 208, 222, respectively. The Method 600 ends at block 624.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal," in association with reference to a side view is defined as a plane parallel to the conventional plane or surface of the processing device 202 and/or interposer 208, regardless of the actual spatial orientation of the processing device 202 and/or interposer 208. The term "horizontal," in association with reference to a normal view is defined as a plane perpendicular to the conventional plane or surface of the processing device 202 and/or interposer 208, regardless of the actual spatial orientation of the processing device 202 and/or interposer 208. The term "vertical" refers to a direction perpendicular to the horizontal, as just defined. The term "diagonal" refers to a direction between the vertical and the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

What is claimed is:

1. An interposer comprising:
a matrix of contacts arranged in rows and columns, wherein the matrix of contacts comprise:
a plurality of first contacts each comprising a major axis and a minor axis, wherein a surface area of each of the plurality of first contacts decreases radially away from a center of the interposer; and
a plurality of second contacts each comprising diameter axes,
wherein the major axis of the plurality of first contacts are aligned with a direction of expansion of the interposer.

2. The interposer of claim 1, wherein the plurality of first contacts are located within a power/ground region of the interposer and the plurality of second contacts are located within an input/output region of the interposer.

3. The interposer of claim 1, wherein the plurality of first contacts are located within a quintain of the interposer and the plurality of second contacts are located within an perimeter region of the interposer that complexly surrounds the quintain.

4. The interposer of claim 1, wherein the plurality of first contacts comprise a diagonal contact nearest the interposer center.

5. The interposer of claim 4, wherein the first contacts within the same row as the diagonal contact are rotated relative to the diagonal contact.

6. The interposer of claim 4, wherein the first contacts within the same column as the diagonal contact are rotated relative to the diagonal contact.

7. The interposer of claim 4, wherein the first contacts within the same row as the diagonal contact have aspect ratios and wherein the first contacts within the same column as the diagonal contact have different aspect ratios.

8. A processing device comprising:
a matrix of contacts arranged in rows and columns, wherein the matrix of contacts comprise:
a plurality of first contacts each comprising a major axis and a minor axis, wherein a surface area of each of the plurality of first contacts decreases radially away from a center of the processing device; and
a plurality of second contacts each comprising diameter axes,
wherein the major axis of the plurality of first contacts are aligned with a direction of expansion of the processing device.

9. The processing device of claim 8, wherein the plurality of first contacts are located within a power/ground region of the processing device and the plurality of second contacts are located within an input/output region of the processing device.

10. The processing device of claim 8, wherein the plurality of first contacts are located within a quintain of the processing device and the plurality of second contacts are located within an perimeter region of the processing device that complexly surrounds the quintain.

11. The processing device of claim 8, wherein the plurality of first contacts comprise a diagonal contact nearest the processing device center.

12. The processing device of claim 11, wherein the first contacts within the same row as the diagonal contact are rotated relative to the diagonal contact.

13. The processing device of claim 11, wherein the first contacts within the same column as the diagonal contact are rotated relative to the diagonal contact.

14. The processing device of claim 11, wherein the first contacts within the same row as the diagonal contact have aspect ratios and wherein the first contacts within the same column as the diagonal contact have different aspect ratios.

* * * * *